(12) United States Patent
Ward et al.

(10) Patent No.: US 10,886,722 B2
(45) Date of Patent: Jan. 5, 2021

(54) ARC FAULT CURRENT DETECTOR (71) Applicant: Shakira Limited, Ballinasloe (IE)

(72) Inventors: Patrick Ward, Ballinasloe (IE); Donal O'Brien, Ballinasloe (IE); Andrii Vikliuk, Ballinasloe (IE)

(73) Assignee: Shakira Limited, Ballinasloe (IE)

( * ) Notice: Subject to any disclaimer, the term of this patent is extended or adjusted under 35 U.S.C. 154(b) by 222 days.

(21) Appl. No.: 16/068,076

(22) PCT Filed: Oct. 17, 2016

(86) PCT No.: PCT/EP2016/074845
§ 371 (c)(1),
(2) Date: Jul. 3, 2018

(87) PCT Pub. No.: WO2017/129277
PCT Pub. Date: Aug. 3, 2017

(65) Prior Publication Data
US 2019/0181628 A1 Jun. 13, 2019

(30) Foreign Application Priority Data

Jan. 26, 2016 (GB) .................................. 1601425.0

(51) Int. Cl.
*H02H 1/00* (2006.01)
*G01R 31/12* (2020.01)
(Continued)

(52) U.S. Cl.
CPC ........ *H02H 1/0015* (2013.01); *G01R 31/1272* (2013.01); *H02H 3/46* (2013.01); *H01F 38/28* (2013.01)

(58) Field of Classification Search
CPC .... H02H 1/0015; H02H 3/46; G01R 31/1272; H01F 38/28
(Continued)

(56) References Cited

U.S. PATENT DOCUMENTS 1,786,853 A 12/1930 Klemm
4,616,176 A 10/1986 Mercure et al.
(Continued)

FOREIGN PATENT DOCUMENTS

DE 4400418 A1 8/1994
GB 2501693 A 11/2013
(Continued)

OTHER PUBLICATIONS

International Search Report and Written Opinion for International Patent Application No. PCT/EP2016/074845, dated Mar. 28, 2017, 19 pages.
(Continued)

Primary Examiner — Kevin J Comber
(74) Attorney, Agent, or Firm — Withrow & Terranova, P.L.L.C.

(57) ABSTRACT

An arc fault current detector for an electricity supply having at least two supply conductors (P1, P2) comprises a coil (L1) disposed adjacent to but not surrounding at least one of the conductors and inductively coupled thereto. A circuit (14) is connected to the coil for detecting a signal induced in the coil having frequency characteristics corresponding to an arc fault in the supply.

8 Claims, 7 Drawing Sheets (51) Int. Cl.
*H02H 3/46* (2006.01)
*H01F 38/28* (2006.01)

(58) Field of Classification Search
USPC .......................................................... 361/42
See application file for complete search history.

(56) References Cited

U.S. PATENT DOCUMENTS

| | | | |
|---|---|---|---|
| 4,887,272 A | 12/1989 | Karube et al. | |
| 4,933,630 A | 6/1990 | Dupraz | |
| 5,521,572 A * | 5/1996 | Goodwin | H01F 38/30 336/175 |
| 5,835,321 A * | 11/1998 | Elms | H02H 1/0015 361/45 |
| 5,856,902 A | 1/1999 | Hashimoto et al. | |
| 6,366,076 B1 | 4/2002 | Karrer et al. | |
| 6,373,257 B1 | 4/2002 | Macbeth et al. | |
| 6,414,829 B1 | 7/2002 | Haun et al. | |
| 6,614,218 B1 | 9/2003 | Ray | |
| 6,670,799 B1 | 12/2003 | Bull et al. | |
| 6,876,528 B2 * | 4/2005 | Macbeth | G01R 15/183 361/42 |
| 6,972,572 B2 | 12/2005 | Mernyk et al. | |
| 7,598,724 B2 | 10/2009 | Howell et al. | |
| 8,599,523 B1 | 12/2013 | Ostrovsky et al. | |
| 8,743,513 B2 | 6/2014 | Ward et al. | |
| 2003/0058596 A1 | 3/2003 | MacBeth | |
| 2004/0156153 A1 | 8/2004 | Csanky et al. | |
| 2004/0263183 A1 | 12/2004 | Naidu et al. | |
| 2006/0220774 A1 | 10/2006 | Skendzic | |
| 2006/0262466 A1 | 11/2006 | Engel | |
| 2007/0247767 A1 | 10/2007 | Zhang | |
| 2009/0147412 A1 | 6/2009 | Kojovic et al. | |
| 2009/0187285 A1 | 7/2009 | Yaney et al. | |
| 2010/0013460 A1 | 1/2010 | Ermisch et al. | |
| 2010/0045417 A1 | 2/2010 | Feng et al. | |
| 2010/0309591 A1 | 12/2010 | Shea et al. | |
| 2011/0043190 A1 | 2/2011 | Farr | |
| 2011/0050154 A1 | 3/2011 | Farr | |
| 2011/0260824 A1 | 10/2011 | Fornage et al. | |
| 2013/0038971 A1 | 2/2013 | Ward et al. | |

FOREIGN PATENT DOCUMENTS

| | | |
|---|---|---|
| WO | 2004059811 A1 | 7/2004 |
| WO | 2011151267 A2 | 12/2011 |

OTHER PUBLICATIONS

International Search Report and Written Opinion for International Patent Application No. PCT/EP2016/074845, dated Jul. 31, 2018, 12 pages.
Non-Final Office Action for U.S. Appl. No. 13/642,996, dated Oct. 7, 2013, 6 pages.
Notice of Allowance for U.S. Appl. No. 13/642,996, dated Jan. 24, 2014, 9 pages.
International Search Report and Written Opinion for International Patent Application No. PCT/EP2011/058754, dated Feb. 7, 2012, 15 pages.

* cited by examiner

ARC FAULT CURRENT DETECTOR

This is a 35 USC 371 national phase filing of PCT/EP2016/074845, filed Oct. 27, 2016, which claims priority to UK patent application 1601425.0, filed Jan. 26, 2016, the disclosures of which are incorporated herein by reference in their entireties.

FIELD

This invention relates to an arc fault current detector.

BACKGROUND

Arcing is a normal function of switching loads or equipment on or off or running certain types of equipment such as motors, etc. Such arcing is not dangerous and will not normally pose an electric fire threat. On the other hand, arc fault currents that are sustained can pose a fire threat and should preferably be detected and interrupted before posing a serious fire risk. This is the function of arc fault current detectors.

U.S. Pat. No. 8,743,513 describes a technique for detecting arc fault currents, and also describes various techniques employed by other inventors. In the vast majority of examples cited, a current transformer is used as the main sensor for detection of a signal arising from an arc fault current. Current transformers (CTs) provide a simple means of detecting arc fault currents but they tend to be bulky and expensive, and the passing of main conductors through the aperture of CTs can present problems of space, manufacturability and cost, etc.

Shunts placed in series with one or more main conductors have also been used for the detection of a signal arising from an arc fault current. The use of shunts as the detecting means gives rise to the appearance of high voltages on the electronic detecting circuitry, and possible isolation problems, and it can also be technically very challenging to use shunts on more than one conductor. For these and other reasons, shunts are rarely used for arc fault current detection.

U.S. Pat. No. 6,972,572 describes a technique using an inductor in series with at least one of the supply conductors, and deriving from the series inductor a signal arising from an arc fault current. It should be noted that the detecting circuitry is connected directly across the inductor part of the main conductor which may give rise to the appearance of high voltages on the electronic detecting circuitry, and possible isolation problems. US2004/0156153 discloses an arc fault detection system comprising a pick-up coil to sense and pick up a broadband arc fault signal from a power cable and to provide the signal to an amplifier. The amplified signal is applied to a high-pass filter to only pass frequency components above a predetermined frequency. The high-passed frequency components are then applied to band-pass filters, using a plurality of non-harmonically related center frequencies to generate narrow frequency slices of the signal. Each slice of the signal is rectified to generate a DC level signal. Detection can be made for each DC level signal using level detectors. Using a logic matrix, an arc fault can be determined when all DC level signals from the event indicate detection, while signals from power and ground sources indicate no system noise.

SUMMARY

According to the present invention there is provided an arc fault current detector according to claim 1.

Embodiments of the invention use one or more inductors for the detection of arc fault currents, the inductors being used merely as detection means and not being required to carry currents or voltages associated with a load or protected circuit. Problems of isolation are not encountered and the inductors can be relatively small and inexpensive and mitigate many of the problems outlined above.

BRIEF DESCRIPTION OF THE DRAWINGS

Embodiments of the invention will now be described, by way of example, with reference to the accompanying drawings, in which.

DETAILED DESCRIPTION

Figure 1:
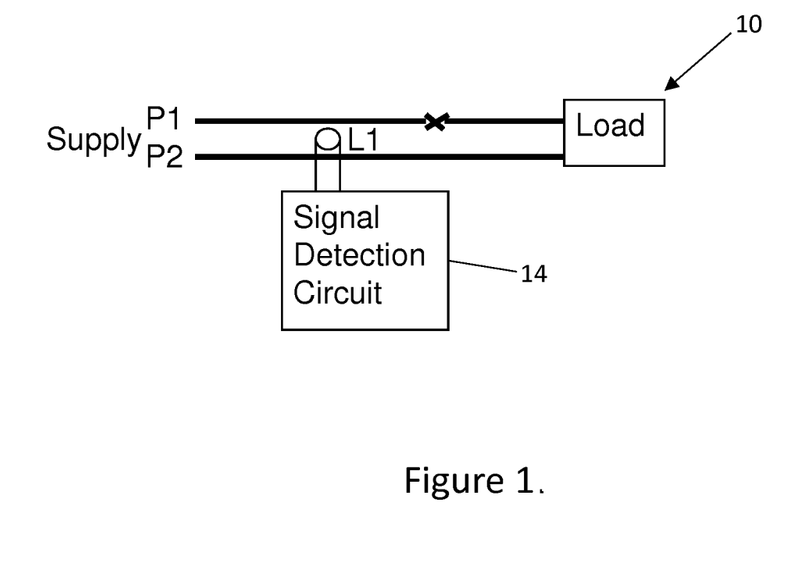
FIG. 1 is a basic embodiment illustrating the principles of operation of the invention.
Figure 8A:
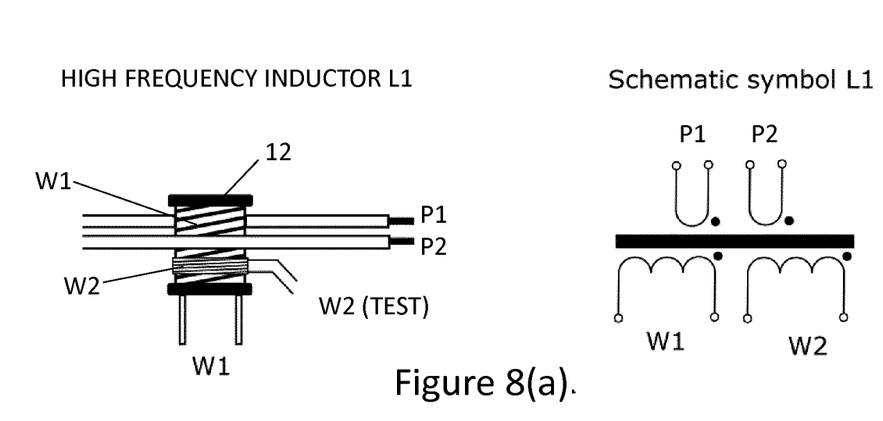
FIGS. 8a and 8b illustrate the high and low frequency inductors L1, L2 used in embodiments of the invention, and their corresponding circuit symbols.

FIG. 1 shows two conductors P1 and P2 connected from a mains electricity supply to a load 10. The conductors could be the Live and Neutral conductors of a single phase system or the Phase 1 and Phase 2 conductors of a two phase system. An inductor L1 comprising a coil W1 wound on a bobbin 12 (FIG. 8a) is placed in close proximity to the two conductors P1, P2. However, the conductors P1, P2 neither pass through the coil W1 nor is the coil electrically connected to either of them. The core of the coil 14 (i.e. the centre of the bobbin 16) may be air but is preferably a magnetically responsive material such as ferrite. In FIG. 8a the winding W2 is an optional test winding and will be described later, together with the test circuitry to the left of P1 in FIGS. 2 to 6.

The coil W1 is connected to an electronic circuit 14 to detect any signal produced by the coil. The point X shown on conductor P1 represents a break in the conductor which can be intermittently closed and opened so as to cause arcing within the conductor. It can be demonstrated that by suitable choice of the characteristics of the inductor L1, an output signal can be produced by the inductor in response to arcing currents over a wide range of frequencies into the MHz range i.e. at frequencies greater than 1 Mhz. L1 resonates in the MHz range due to self or parasitic capacitance, or may be encouraged to resonate in this range by the optional addition of a capacitor C1 as shown for FIG. 2. The inductor output signal can be detected by the electronic circuit 14. It should be noted that there is no direct electrical connection between the inductor and either of the main conductors.

Thus, this simple technique alone can be used for the detection of an arc fault current. However, for practical applications, the arc fault current detector will need to meet the requirements of various product standards such as UL1699 or IEC 62606, etc. These standards set out the requirements for arc fault current detection levels, response times for clearing a fault, detection of arc fault currents on circuits with parallel loads, and tests to verify immunity to nuisance or false tripping in the presence of non-fault arcing which occurs during the operation of certain loads such as power tools and vacuum cleaners, etc.

Figure 2:
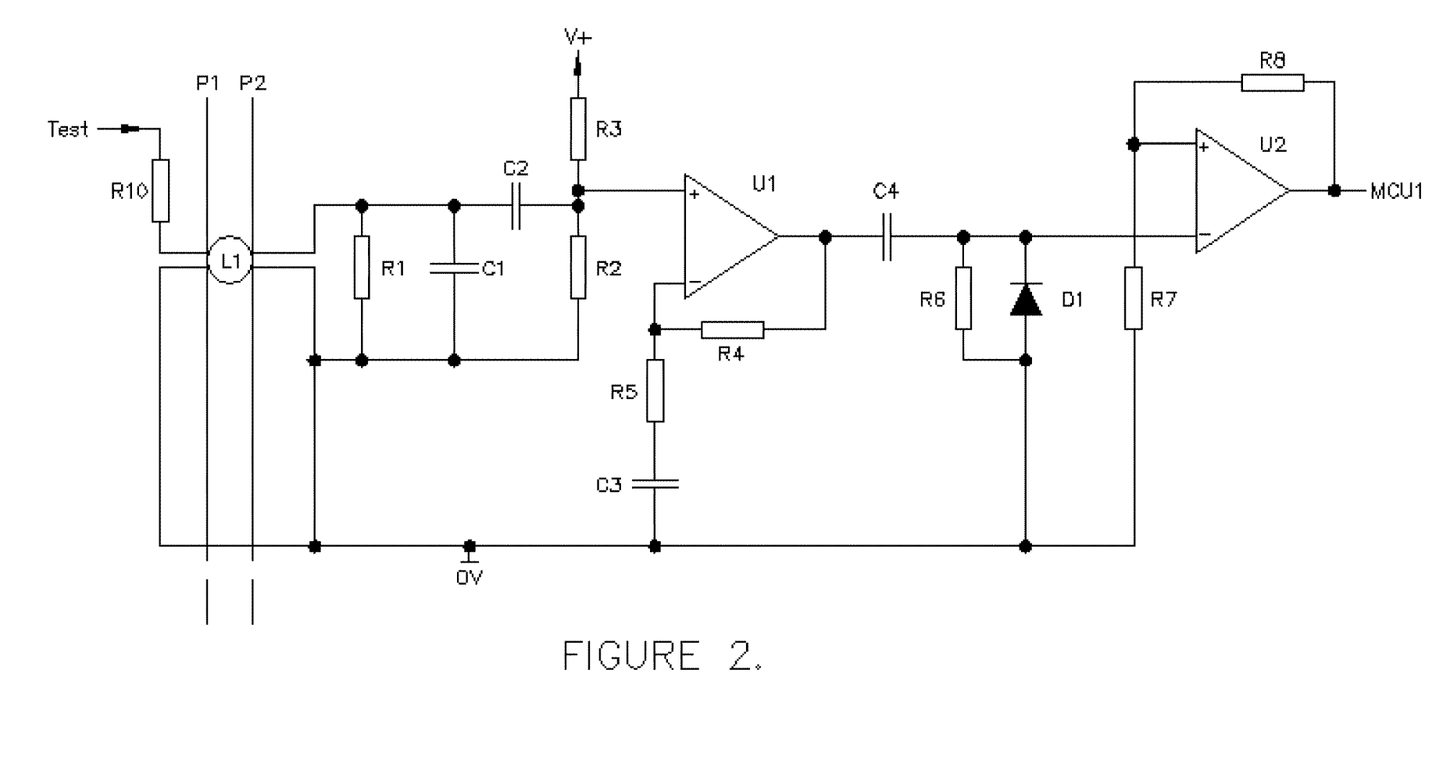
FIGS. 2 to 6 are circuit diagrams of progressively more sophisticated embodiment of the invention.

FIG. 2 shows how the arcing current detection technique outlined in FIG. 1 can be used as the basis for a more practical arc fault current detection circuit.

Generally, in FIG. 2, the high frequency (MHz) analog signal from L1 is amplified by an amplifier circuit U1 and converted to a digital signal MCU1 by a comparator U2. The output signal from U2 can swing between 0V and V+. The microcontroller analyses signal MCU1 by checking pulse widths and periods and looks for signal patterns having frequency characteristics that are typical for an arc fault current.

More specifically, the two mains supply conductors P1 and P2 are placed in close proximity to inductor L1, and may advantageously be placed on opposite sides of L1, as for FIG. 1. An arc fault current flowing in P1 or P2 will induce energy into L1 with a very wide frequency spectrum up to the MHz range. L1 resonates at frequencies into the MHz range due to self or parasitic capacitance, or may be encouraged to resonate in this range by the optional addition of a capacitor C1. In any event the resultant output is preferably dampened by the inclusion of a resistor R1 across L1. The resultant signal produced by L1 is AC coupled to an AC amplifier U1 via a capacitor C2, the gain of U1 being set by R4, R5 and C3. The input to U1 is normally tied to a voltage level between +v and 0v as set by resistors R2 and R3 with the result that this node can swing positive or negative about this DC level as determined by the signal passed to this node via C2. The output of U1 is AC coupled to a comparator U2 which will produce a series of positive-going pulses over a wide frequency spectrum. These pulses can be fed directly to the input MCU1 of a microprocessor control unit (MCU), FIG. 7, and the MCU can be used to analyse the pulses and to determine the individual pulse widths, the duration of a burst of pulses, discriminate between broad and narrow pulses or the repetition rate of pulses or the frequency of pulses, so as to determine when an arc fault current is present as opposed to normal arcing associated with switching of appliances, etc. When the MCU has determined that an arc fault current is present it can output a FAULT signal which can be used to activate an alarm or activate a circuit breaking means such as a circuit breaker, a contactor or a relay to disconnect the supply and terminate the arc fault current. Such techniques will be familiar to those versed in the art.

Figure 3:
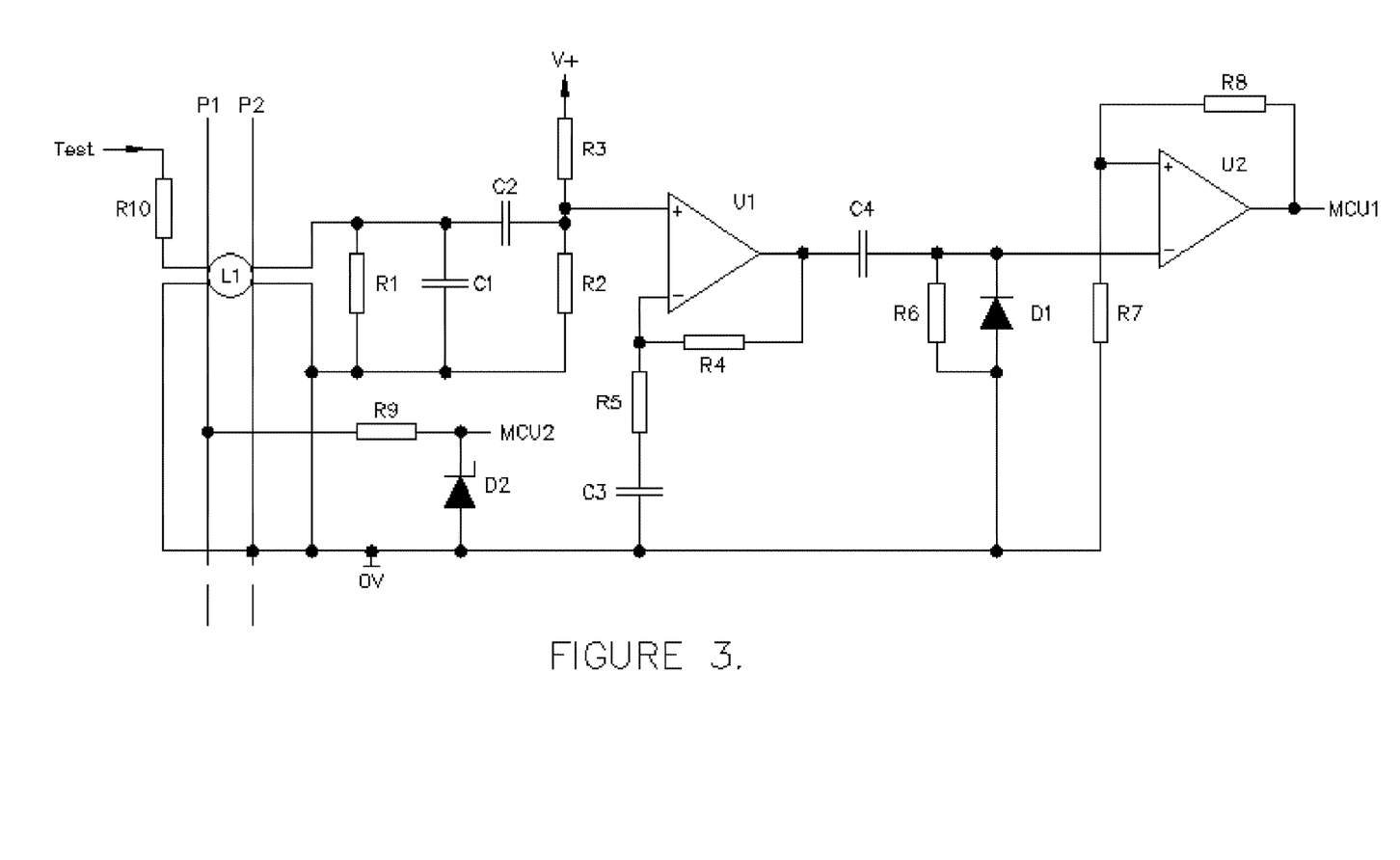

It may be desirable for the MCU to carry out its analysis during intermittent periods of time related to the mains supply, for example for part of or for one or more half cycles of the mains supply. FIG. 3 shows how this can be done very simply where a resistor R9 and a zener diode D2 are connected from one of the mains conductors to the 0V supply of the electronic circuit without making any significant change to the detecting means of FIG. 2 which remains the same in FIG. 3. This will produce a series of pulses that can be fed to an input MCU2 of the MCU. In response, the MCU will only carry out its analysis during the occurrence of a pulse on MCU2. In FIG. 3, the breakdown voltage of D2 is less than the supply voltage of the MCU.

Figure 4:
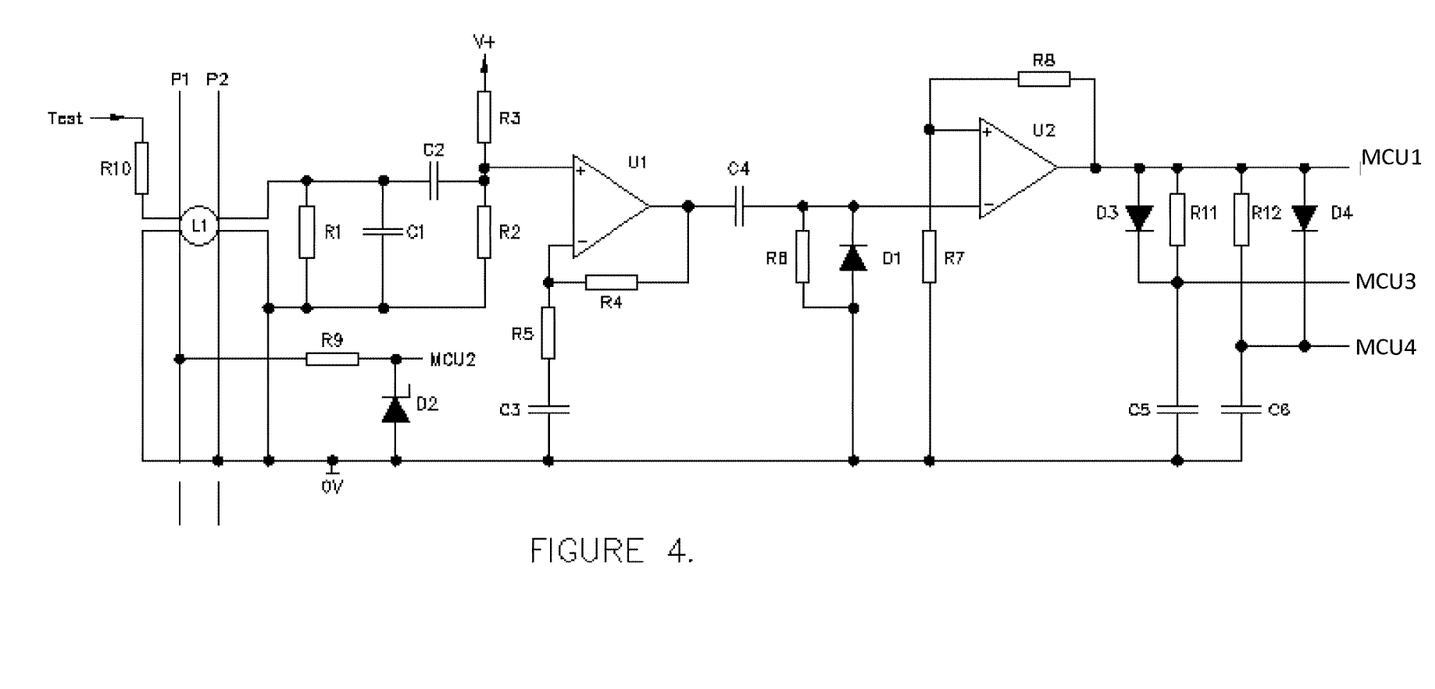

FIG. 4 shows an additional method for discriminating between normal arcing and an arc fault current whilst retaining the detecting means of FIGS. 2 and 3.

The output of U2 is connected to the +ve input of U2 and ground via resistors R8 and R7, with the result that U2 has hysteresis that will cause the +ve input of U2 to change when the output of U2 changes state. On initial power up, U2 −ve input is pulled to ground so U2 output will be high. Diode D1 protects U2 against negative voltage on input. The signals arriving from U1 will swing positive and negative, and positive going signals that exceed U2 +ve input will cause U2 output to go low. This will result in positive going pulses of varying frequencies and varying pulse width to appear at U2 output. As stated previously, the signal produced by L1 can extend up to the MHz range so U2 output pulses can also extend up to this level.

It is well known that the mains wiring in homes is now commonly used for the transmission of signals around the home, for example to replace the use of Wi-Fi® in rooms not provided with a modem, etc. Plug-in adaptors are commonly used for such applications because they can be fitted in any socket outlet in any room in the home to facilitate the reception of Ethernet signals. Such signals could be detected by the simple circuits of FIG. 2 or FIG. 3 and could be mistaken for arc fault current signals and result in nuisance tripping of an arc fault current detector.

In FIG. 4, resistor R11 and capacitor C5 form a first filter which will pass pulses at frequencies up to a first level F1 which has a roll off frequency that extends into the MHz range and captures most of the pulses produced by L1. These pulses are fed to the MCU as input MCU3. Resistor R12 and capacitor C6 form a second filter which will pass pulses at frequencies up to a second level F2 which preferably has a lower roll off frequency than F1. It follows that by manipulation of the values of R12 and C6, the roll off frequency of F2 can be set at any value up to and including the F1 value. The F2 pulses are fed to the MCU as input MCU4.

The MCU can be programmed such that substantially all pulses up to the F2 roll off frequency are ignored by the MCU with the result that the MCU sees only pulses in the frequency window between the roll off frequency of F2 and that of F1. These pulses will vary in frequency and pulse width. The effect of this arrangement is to produce a window of visibility which can exclude signals produced by mains borne signalling devices such as Ethernet powerline transmitters, etc.

For the purpose of discriminating between normal arcing and an arc fault current, the circuit can be subjected to a range of arcing conditions from switching appliances or equipment on and off to running motors to creating genuine arc fault currents etc. and the MCU can then be calibrated to ignore the normal arcing and just respond to the arc fault currents.

Figure 5:
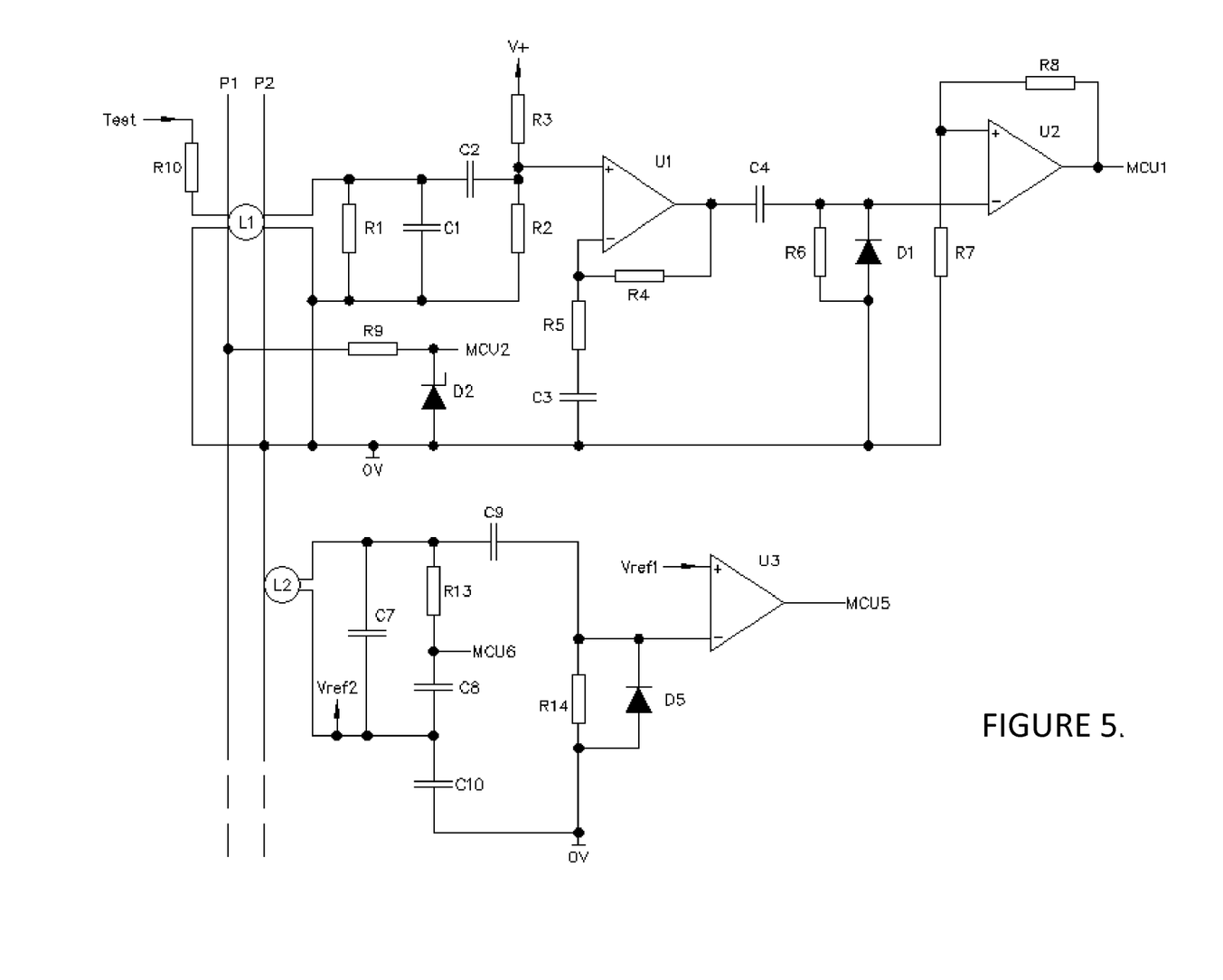

It will be seen that when two conductors P1 and P2 are coupled as shown to L1, it may not be practical to obtain an accurate measurement of the level of a load or an arc fault current without the addition of specific current detection or measuring means. It would be advantageous to know the level of the arc fault current so as to provide another level of discrimination such that currents below a certain level could be disregarded and only arc fault currents above a certain level would be considered for detection and thereby reduce the risk of nuisance tripping. FIG. 5 shows an arrangement for providing such discrimination.

Figure 8B:
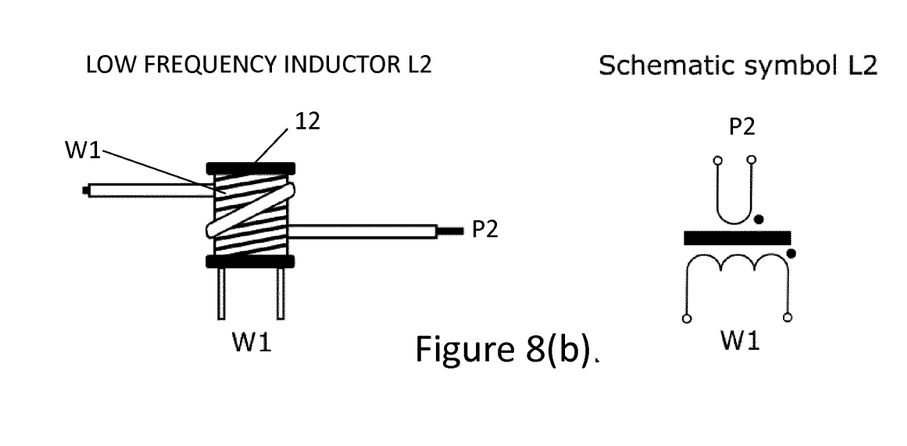

L2 is a second inductor which is used to indicate the magnitude of the load current and to produce signals indicative of arcing. One of the load carrying conductors, in this case P2, is looped around the outside of the inductor so as to induce a signal into the inductor at power (e.g. mains) frequency; see FIG. 8b. Looping as shown provides a closer inductive coupling between P2 and the coil W1, which in the present embodiment is necessary for detecting power frequency signals. However, such looping may not be necessary in all embodiments. Higher frequency signals will also be induced into L2 under arcing conditions. C7 and L2 form a tuned circuit which preferably has a resonant frequency within the range 10 KHz to 150 KHz but in any event is responsive to arcing currents in this range. This is a substantially narrower frequency spectrum than that produced by FIG. 2 and is also centred on a much lower frequency. Provided that the current flowing in conductor P2 is above a certain level, the resultant output across C7 will have a power frequency component that will be detected by low pass filter R13, C8 and will feed a corresponding signal to the MCU as input MCU6. Under arcing conditions, the signal generated within the range 10 KHz to 150 KHz will be fed to comparator U3 by capacitor C9 and U3 will produce corresponding output pulses when the input signals exceed the level of Vref1. These pulses will be fed to the MCU as input MCU5. Thus, the circuit driven by L2 will provide an indication of the power frequency, e.g. 50 Hz or 60 Hz, the magnitude of the power frequency current, and the presence of an arc fault with a current above a certain threshold.

The MCU can then optionally be programmed to produce an output indicative of an arc fault current only when MCU1, MCU2, MCU5 and MCU6 are all present. Using MCU5 in particular enables the MCU to discriminate between relatively low frequency signals and relatively high frequency signals.

Figure 6:
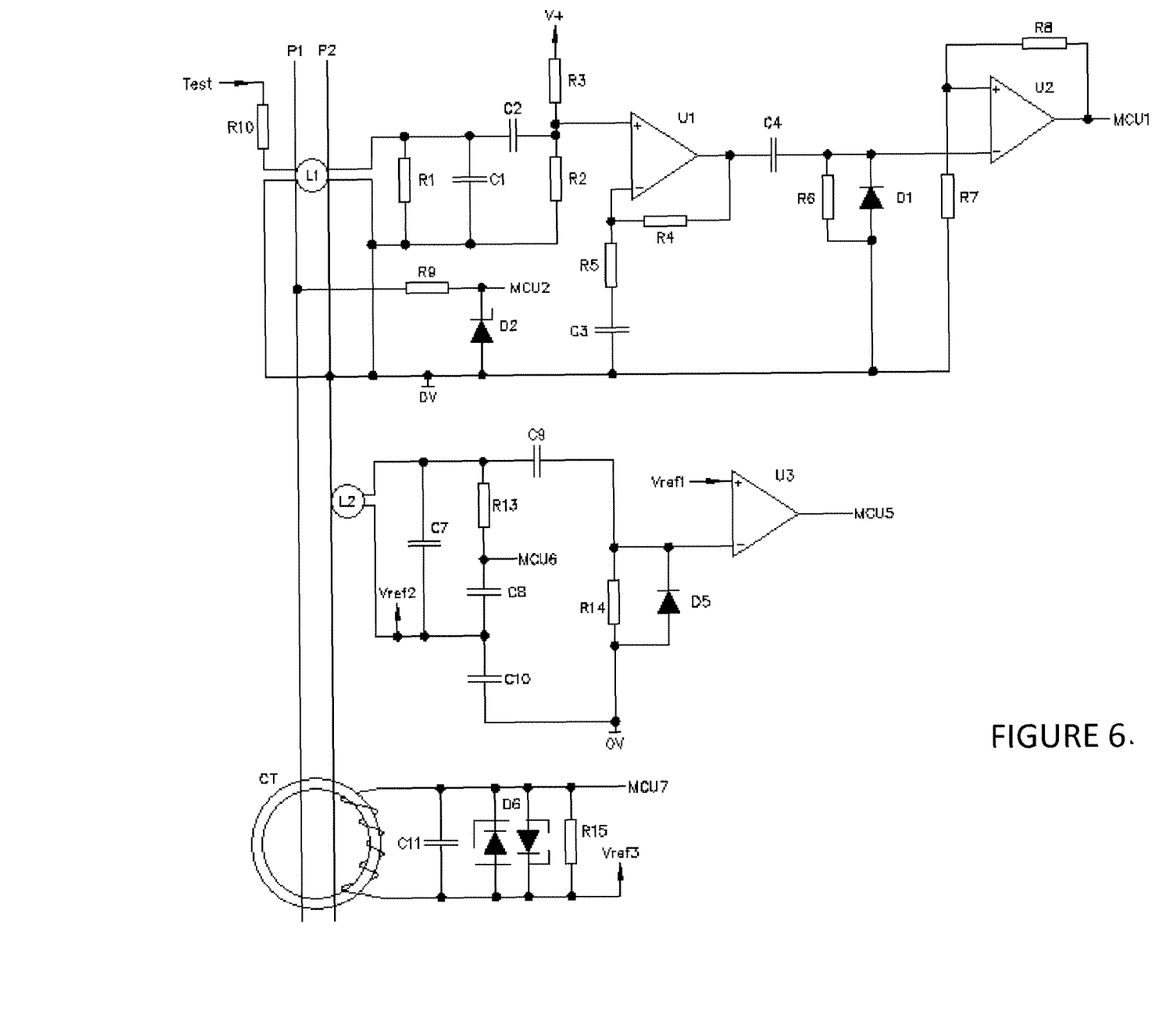

It may be advantageous to include detection of ground fault currents to the arc fault current detector, and a means to achieve this is shown in FIG. 6. The mains conductors P1 and P2 are passed through a current transformer CT whose output is tied to a reference voltage vref3, and any residual current flowing in the mains conductors will produce an output which is fed to the MCU as input MCU7. When MCU7 exceeds a certain threshold it will indicate the presence of a ground fault current above a certain level. Ground fault current detectors are very well known and no further description thereof is thought necessary.

It may also be advantageous to be able to test the circuit from L1 through to the MCU. This is facilitated with a TEST from the MCU output that can be activated by manual operation of a test button, not shown. When the test button is operated, a serious of pulses will be produced at TEST output and these will be fed to a test winding W2 (FIG. 8a) on L1 via a resistor R10. The test winding on L1 may be one or more turns and is wound in the same direction as the inductor winding W1 on L1. In this case L1 will produce an output that will be detected and amplified by U1 and result in an output from MCU1. When the test button is operated and the TEST pulses are produced the MCU will be looking for a signal at MCU1 even in the absence of all other MCU inputs and will cause the FAULT output to be activated when it detects MCU1 under the test conditions.

Figure 7:
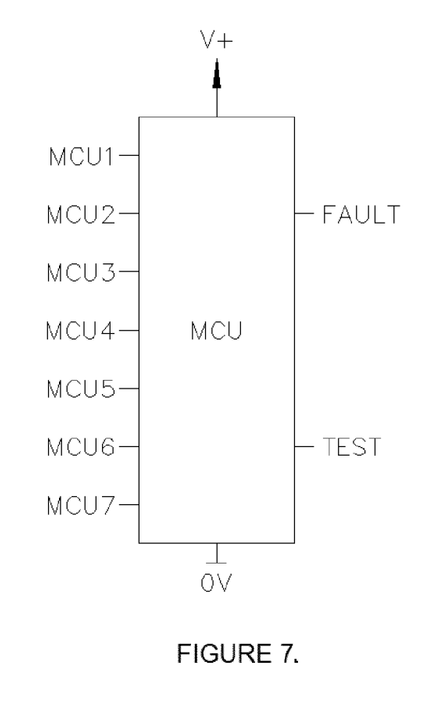
FIG. 7 is a diagram of a microprocessor control unit (MCU) used in the embodiments.

FIG. 7 shows all of the inputs to the MCU, i.e. MCU1 to MCU7. The MCU will produce an output at the FAULT pin if MCU7 exceeds a certain level and is sustained for a certain period or duration. Likewise, if MCU1 and MCU5 are both present and sustained for a certain period the MCU can be programmed to produce a FAULT output, or if MCU1, MCU2 and MCU5 are all present and sustained for a certain period the MCU can be programmed to produce a FAULT output, if MCU2, MCU3, MCU4 and MCU5 or if MCU1, MCU2, MCU5 and MCU6 are all present and sustained for a certain period the MCU can be programmed to produce a FAULT output.

The invention is not limited to the embodiments described here in which may be modified or varied without departing from the scope of the invention.

FIG. 1 shows an example of a series arc fault condition, but the invention could be used to also detect parallel arc fault currents without any significant modification.

The supply in FIG. 1 could be a DC supply to a suitable load, and an arc fault current arising from the break at point X would still produce arcing signals that could be detected by Signal Detection Circuit 14.

The circuit of FIG. 2 could be supplied from the DC supply and the arc fault current signals would be detected and produce an output at MCU1 as previously described.

The arrangement of FIG. 3 for synchronisation to an AC mains supply (i.e. R9 and D2 and MCU2) could be omitted for DC applications. However, even with the omission of R9 and D2, the arrangement of FIG. 4 could still be used for detection of DC arc fault currents.

In FIG. 5, L2 is used to provide an indication of the magnitude of the AC load current and to produce signals over a certain frequency range, e.g. 10 KHz to 150 KHz arising from an arc fault current. Similar signals would still be produced by a DC arc fault current, and alternative means for measuring the magnitude of the DC load current could be readily provided if required.

The invention claimed is:

1. An arc fault current detector for an electricity supply having at least two supply conductors, the detector comprising:
    a first inductor comprising a coil wound about a core, wherein the first inductor is disposed with the coil adjacent to but with the core not surrounding at least one of the conductors and inductively coupled thereto, and wherein the first inductor is responsive to frequencies into the MHz range;
    a first circuit connected to the coil of the first inductor for detecting a signal induced in the coil having frequency characteristics representative of an arc fault in the electricity supply;
    a second inductor comprising a coil wound about a core, wherein the second inductor is disposed with the coil adjacent to but with the core not surrounding at least one of the conductors and inductively coupled thereto, and wherein the second inductor is responsive to both supply frequency signals and to arcing currents in the range 10 KHz to 150 Khz; and
    a second circuit connected to said second inductor and configured to provide an indication of a magnitude of a power frequency current, and the presence of an arc fault with an arcing current above a certain threshold.

2. An arc fault current detector as claimed in claim 1, wherein the signal induced in the coil of the first inductor is connected to an input of a comparator to produce a series of pulses at a comparator output, the series of pulses being applied to an analysing circuit for analysing the series of pulses to determine if they are representative of an arc fault current.

3. An arc fault current detector as claimed in claim 2, further including a circuit to define intermittent periods during which the analysing circuit analyses the series of pulses from the comparator.

4. An arc fault current detector as claimed in claim 2, further including a circuit for defining a frequency window, the analysing circuit only analysing pulses occurring at frequencies within the frequency window.

5. An arc fault current detector as claimed in claim 4, wherein the frequency window is defined by two filters having different roll off frequencies, wherein the series of pulses are applied to both filters prior to applying them to the analysing circuit, and wherein an output of each filter is applied to the analysing circuit.

6. An arc fault current detector as claimed in claim 1, wherein the at least one conductor is looped around the second inductor.

7. An arc fault current detector as claimed in claim 1 further comprising a current transformer through which said at least two supply conductors pass and a winding, so that any residual current flowing in said at least two supply conductors will produce an output from said winding, said arc fault detector comprising a third circuit connected to said winding further configured to provide an indication when said residual current exceeds a certain threshold.

8. An arc fault current detector as claimed in claim 7 further comprising a programmable microcontroller operably connected to outputs of said first, second and third circuits to provide an indication of the presence of an arc fault.

\* \* \* \* \*